United States Patent
Preu et al.

(10) Patent No.: US 8,828,790 B2
(45) Date of Patent: Sep. 9, 2014

(54) METHOD FOR LOCAL CONTACTING AND LOCAL DOPING OF A SEMICONDUCTOR LAYER

(75) Inventors: Ralf Preu, Freiburg (DE); Andreas Grohe, Freiburg (DE); Daniel Biro, Freiburg (DE); Jochen Rentsch, Emmendingen (DE); Marc Hofmann, Gottenheim (DE); Jan-Frederik Nekarda, Freiburg im Breisgau (DE); Andreas Wolf, Freiburg (DE)

(73) Assignee: Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 608 days.

(21) Appl. No.: 13/061,158

(22) PCT Filed: Aug. 20, 2009

(86) PCT No.: PCT/EP2009/006037
§ 371 (c)(1),
(2), (4) Date: May 31, 2011

(87) PCT Pub. No.: WO2010/022889
PCT Pub. Date: Mar. 4, 2010

(65) Prior Publication Data
US 2011/0233711 A1    Sep. 29, 2011

(30) Foreign Application Priority Data

Aug. 29, 2008    (DE) .................. 10 2008 044 882

(51) Int. Cl.
*H01L 21/00*    (2006.01)
*H01L 31/18*    (2006.01)
*H01L 21/225*   (2006.01)
*H01L 31/0224*  (2006.01)

(52) U.S. Cl.
CPC ........ *H01L 31/022425* (2013.01); *H01L 31/18* (2013.01); *H01L 21/2254* (2013.01); *Y02E 10/52* (2013.01)
USPC ............. 438/98; 438/510; 438/537; 257/449; 257/E21.157

(58) Field of Classification Search
USPC ............. 438/510, 537, 98; 257/449, E21.157
See application file for complete search history.

(56) References Cited

U.S. PATENT DOCUMENTS

| 7,029,943 B2 | 4/2006 | Kruhler |
| 2006/0183307 A1 | 8/2006 | Rohatgi et al. |

FOREIGN PATENT DOCUMENTS

| CN | 1455959 | 11/2003 |
| DE | 10046170 | 4/2002 |
| DE | 102006040352 | 10/2007 |
| DE | 102006046726 | 4/2008 |
| WO | 2007126441 | 11/2007 |
| WO | WO 2007126441 A2 * | 11/2007 |

* cited by examiner

Primary Examiner — Kenneth Parker
Assistant Examiner — John Lin
(74) Attorney, Agent, or Firm — Volpe and Koenig, P.C.

(57) ABSTRACT

A method for local contacting and local doping of a semiconductor layer including the following process steps: A) Generation of a layer structure on the semiconductor layer through i) application of at least one intermediate layer on one side of the semiconductor layer, and ii) application of at least one metal layer onto the intermediate layer last applied in step i), wherein the metal layer at least partly covers the last applied intermediate layer, B) Local heating of the layer structure in such a manner that in a local region a short-time melt-mixture of at least partial regions of at least the layers: metal layer, intermediate layer and semiconductor layer, forms. After solidification of the melt-mixture, a contacting is created between metal layer and semiconductor layer. It is essential that in step A) i) at least one intermediate layer designed as dopant layer is applied, which contains a dopant wherein the dopant has a greater solubility in the semiconductor layer than the metal of the metal layer.

16 Claims, 2 Drawing Sheets

METHOD FOR LOCAL CONTACTING AND LOCAL DOPING OF A SEMICONDUCTOR LAYER

BACKGROUND

The invention relates to a method for local contacting and local doping of a semiconductor layer and a semiconductor structure having at least one local doping.

It is known to contact a surface of a semiconductor layer, covered with at least one passivating dielectric layer, such that a metal layer is applied upon the dielectric layer and the metal layer is briefly heated locally via a radiation source. This heating leads to a local melt-mixture of the metal layer, the dielectric layer, and the semiconductor, so that after the melt-mixture has solidified an electric contact develops between the semiconductor and the metal layer.

Such a method is particularly used in the production of solar cells and described in DE 100 46 170 A1, for example.

SUMMARY

The present invention is based on the object of improving the known method such that the contact features are improved particularly with regards to the recombination features of the semiconductor surface in the area of the contact so that another optimization of the effectiveness of the solar cell is achieved and/or the production costs are further reduced.

This object is attained in a method for the local contacting and local doping of a semiconductor layer as well as a semiconductor structure according to the invention. Advantageous embodiments of the method according to the invention as well as an advantageous embodiment of the semiconductor structure according to the invention are described below.

The method according to the invention for locally contacting and locally doping a semiconductor layer comprises a processing step A, in which a layer structure is created on the semiconductor layer.

The semiconductor layer typically comprises a semiconductor wafer, such as a silicon wafer. However, the method according to the invention may also be used for any other semiconductor layer, such as a semiconductor layer at the surface of a laminated structure, for example.

The processing step A of the method comprises the processing steps i and ii, with in the processing step i at least one intermediate layer being applied onto one side of the semiconductor layer. Subsequently, in the processing step ii, at least one metal layer is applied upon the intermediate layer most recently applied in step i, with the metal layer at least partially covering the most recently applied intermediate layer.

When using the method according to the invention for producing a rear contact, typically the intermediate layer will essentially cover the side of the semiconductor layer in its entirety and the metal layer will essentially cover the entire intermediate layer. However, the scope of the invention also includes, for example, an embodiment with frontal contacts of a solar cell, in which the intermediate layer only partially covers the side of the semiconductor layer and/or the metal layer only partially covers the intermediate layer.

In a processing step B, the layer structure is locally heated such that in a section briefly a melt-mixture develops comprising at least partial areas of at least the metal layer, the intermediate layer, and the semiconductor layer, and after the melt-mixture has solidified a contact forms between the metal layer and the semiconductor layer. If the solar cell according to the invention comprises several intermediate layers at the location of the local heating, the melt-mixture is preferably formed from partial areas of all intermediate layers, the metal layer, and the semiconductor layer.

Therefore, an electrically conductive connection exists between the metal layer and the semiconductor layer in the area the melt-mixture has solidified.

It is essential that in the method according to the invention at least one intermediate layer represents a doping layer. This doping layer includes a dopant, with the dopant showing a higher solid-matter solvency in the semiconductor layer than the solid-matter solvency of the metal of the metal layer in the semiconductor layer.

The invention is based on the knowledge of the inventor that during recrystallization, due to the use of a doping layer, the dopant is integrated in a substituting fashion into the crystalline grid of the semiconductor in a higher concentration based on to its solid-matter solubility being greater than the one of the metal of the metal layer and thus, after the melt-mixture has solidified, a locally high doping develops in the area of the electric contact between the metal layer and the semiconductor layer due to the dopant.

In order to create high-efficiency solar cells it is known to create locally high doping areas in those sections of the semiconductor layer, using several photo-lithographic steps and inward diffusion, in which during subsequent processing steps the electric contacting shall occur between the metal layer and the semiconductor layer.

By using the method according to the invention, it is possible for the first time with a local heating of the layer structure preferably via a radiation source, particularly a laser, to simultaneously produce locally high doping as well as electric contacting between the metal layer and the semiconductor layer. The method according to the invention particularly comprises the advantage that the locally high doping always develops in the section of the semiconductor layer in which the electric contacting occurs between the metal layer and the semiconductor layer. Any local adjustment between the areas of the locally high doping and the electric contacting is therefore excluded.

In reference to methods for locally high doping of prior art, the method according to the invention additionally shows the advantage that any removal of the doping layer can be avoided. Rather, both the doping layer and the metal layer remain on the semiconductor layer and also on the finished solar cell for example so that no additional processing steps are necessary for removing the doping layer.

The contacting features are considerably improved by the locally high doping with the dopant, particularly the contact resistance between the semiconductor layer and the metal layer is reduced and the boundary area between the semiconductor surface and the metal layer is considerably better protected from the recombination of carriers of minority charges and thus the electric features are improved. Particularly in the application of the method according to the invention for producing solar cells these improvements lead to an increase in effectiveness and/or to a reduction of costs during manufacturing because no additional processing steps are necessary to produce the locally high doping.

The object is further attained in a semiconductor structure according to the invention. The semiconductor layer comprises a semiconductor layer, at least one intermediate layer on one side of the semiconductor layer, and at least one metal layer, which at least partially covers the intermediate layer or, in case of several intermediate layers, the most recently applied intermediate layer and/or the intermediate layer located farthest away from the semiconductor layer, with the semiconductor structure comprising at least one local area, which represents a solidified melt-mixture of sections of at least the metal layer, the first layer, and the semiconductor layer, so that the metal layer and the semiconductor layer are connected in an electrically conducting fashion at the location of the solidified melt-mixture. The solidified melt-mixture is the result of a short local heating, which briefly causes the existence of a local melt-mixture of the above-mentioned layers.

It is essential that at least one intermediate layer is a doping layer, which comprises a dopant, with the dopant having a higher solubility in the semiconductor layer than the metal of the metal layer.

The semiconductor layer according to the invention is preferably produced via the method according to the invention.

A minimum concentration of the dopant in the doping layer is advantageous in order to achieve a sufficiently high concentration of the dopant after the melt-mixture has solidified.

Beneficially the concentration of the dopant in the doping layer is equal or greater than $1 \times 10^{21}$ cm$^{-3}$, particularly beneficial is a concentration equal or greater than $5 \times 10^{21}$ cm$^{-3}$.

It is particularly advantageous if the concentration of the dopant for a selected thickness of the doping layer is standardized for the unit of area of the boundary semiconductor layer/doping layer and amounts to at least $2.5 \times 10^{14}$ cm$^{-2}$, particularly at least $1 \times 10^{15}$ cm$^{-2}$. If the doping layer is applied upon an intermediate layer, the above-mentioned values per unit of area are advantageous for the boundary intermediate layer/doping layer.

Experiments of the applicant have shown that advantageously such elements are used as dopants which are part of the main Group III or V of the periodic table and/or compounds showing such elements as their components. In particular, it is advantageous that the dopant is boron or phosphorus or gallium.

The applicant was able to produce very good contacting results in experiments using the method according to the invention in which the doping layer was embodied from boron-silicate glass.

For a further improvement of the effectiveness of solar cells it is advantageous that the first intermediate layer applied upon the semiconductor layer has a passivating effect with regards to the speed of surface recombination at the boundary of said semiconductor layer towards said first intermediate layer. This way, the recombination of the carriers of the minority charge is avoided by the locally high doping at the areas of the electric contacting but also at the areas between the locally high dopings due to the passivating effect of the first intermediate layer applied upon the semiconductor layer.

Here, it is within the scope of the invention that only the doping layer is applied between the semiconductor layer and the metal layer and the doping layer is embodied such that it achieves the above-described passivating effect. In particular, it is advantageous, though, first to apply a layer upon the surface of the semiconductor layer particularly suitable for passivating the surface, subsequently the doping layer upon said passivating layer, and finally to apply the metal layer upon the doping layer.

The doping layer is advantageously thinner than 1 μm, particularly thinner than 500 nm. This way, sufficient heat conductivity is ensured during a local introduction of heat in order to create the melted layer.

In another advantageous embodiment of the method according to the invention the local melting occurs in an essentially punctual or linear area.

In particular it is advantageous to use punctual contacts for the creation of contacts at the rear of a solar cell. However, for the creation of frontal contacts at a solar cell it is advantageous to create linear contact, because typically solar cells are contacted at the front by linear metallic structures connected to each other in a comb-like fashion.

Advantageously the local area in which the layers are melted shows a diameter of less than 500 μm, particularly less than 200 μm. This ensures that in the adjacent areas, in which no contacting occurs, the crystalline structure of the semiconductor is not damaged and thus its electric features are not compromised.

Advantageously a multitude of local contacts and locally high dopings are created via the method according to the invention. In particular, it is advantageous in solar cells that the portion of the overall area of all melted sections in reference to the total surface area of the semiconductor layer amounts to less than 20%, particularly to less than 5%. An excessive portion of the areas with high doping and electric contacting would lead to an increased combination of carriers of minority charges; the above-stated percentages ensure an optimal ratio between the contacting sections with locally high doping and the areas with increased surface passivation.

As described above, in the processing step B a local heating of the laminate occurs such that a melt-mixture forms.

Advantageously, in step B the local heating is executed such that at least the temperature of the eutectic point of the melt-mixture is reached, particularly that the laminate structure is locally heated to at least 550 degrees centigrade.

As described above, the method according to the invention has the advantage that no removal of the doping layer is required. The transportation of the charge carriers thus occurs, beginning at the semiconductor layer, from the semiconductor layer to the area of the solidified melt-mixture in the metal layer, and from there into potentially connected external circuits and/or a neighboring solar cell in case of modular wiring.

Typically, the metal layer is embodied to minimize loss due to ohmic resistance. Thus it is advantageous for the doping layer to show a resistance greater than the resistance of the metal layer by at least a factor of 10, particularly at least by a factor of 100, preferably by at least a factor of 1000 so that the current flow occurs parallel to the surface of the semiconductor layer essentially within said semiconductor layer and in the metal layer, however not in the doping layer.

In particular, it is advantageous that the doping layer is electrically insulating. This way, additionally a barrier is formed against any undesired contacts between the metal layer and the semiconductor layer.

In order to improve the optic features of the solar cell it is advantageous for at least the first of the layers applied on the semiconductor layer to be an optically transparent layer, particularly a layer transparent in the range of wavelengths from 300 nm to 1500 nm.

This is necessary for the use of the method according to the invention to create frontal contacts of a solar cell, because in this case the electromagnetic radiation is received via the front of the semiconductor layer and thus transparency is necessary particularly in the spectral range relevant for solar cells.

However, it is also advantageous to embody the intermediate layer in a transparent fashion, as described above, when the method according to the invention is used to create rear contacts at a solar cell, because this way the reflective features of the rear of the solar cell are improved and the electromagnetic radiation impinging the solar cell and reaching its rear is reflected and thus the overall absorption of radiation in the solar cell, and thus the effectiveness of the solar cell, is increased.

Another increase of the effectiveness of the solar cell can be achieved with the method according to the invention in an advantageous embodiment by applying an additional intermediate layer between the doping layer and the metal layer, with this intermediate layer being embodied without any corrosive features in reference to the metal layer. This way, a reduction of the effectiveness due to corrosion of the metallic conductor layer is avoided or at least reduced and consequently the degradation of the effectiveness of the solar cell due to environmental influences is reduced.

Such layers are preferably produced from the materials silicon dioxide or silicon nitride or silicon carbide.

In another preferred embodiment of the method according to the invention an additional intermediate layer is applied between the semiconductor layer and the doping layer. This intermediate layer preferably comprises silicon dioxide or amorphous silicon or amorphous silicon nitride or aluminum oxide. Similarly, the scope of the invention also comprises for such an intermediate layer to be made from a combination of the above-mentioned materials, such as described in M. Hofmann et al., *Proceedings of the 21$^{st}$ EU-PVSEC*, Dresden, 2006.

These layers particularly show very good passivating effectiveness with regards to features of surface recombination of the semiconductor layer.

Experiments of the applicant have shown that particularly the following laminate system is advantageous for the method according to the invention.

A passivation layer having a thickness from approximately 10 nm to 30 nm is applied onto a silicon wafer (semiconductor layer), subsequently a doping layer having a thickness from approximately 100 nm to 200 nm, thereupon an intermediate layer free from any corrosive features, for example a layer of silicon nitride having a thickness of approximately 30 nm, and finally a metal layer, for example an aluminum layer having a thickness from 0.5 µm to 10 µm, preferably a thickness of approximately 2 µm.

BRIEF DESCRIPTION OF THE DRAWINGS

In the following, additional features and preferred embodiments of the method according to the invention are explained using the figures. Shown here.

DETAILED DESCRIPTION OF THE PREFERRED EMBODIMENTS

For purely competitive reasons, the industrial production of solar cells is subject to the goal of producing solar cells with the highest possible effectiveness, i.e. with the electric current yielded being as high as possible from the solar energy input received by the solar cell, and simultaneously keeping the production expenditures and thus the costs as low as possible.

The following explanations of measures to be observed shall serve for a detailed understanding of the measures for an optimal production of solar cells:

Solar cells are structural parts that transform light into electric energy. Usually they are made from a semiconductor material; most solar cells are made from silicon, comprising the n- and/or p-conducting semiconductor ranges. The semiconductor ranges are called emitters and/or bases, as known per se. Inside the solar cell, positive and negative charge carriers are created by the light impinging the solar cell, which are spatially separated from each other at the boundary area between the n-(emitter) and p-doped (base)—semiconductor area, the so-called p-n junction. By way of metallic contacts, connected to the emitters and the bases, these charge carriers separated from each other can be connected.

Figure 1:
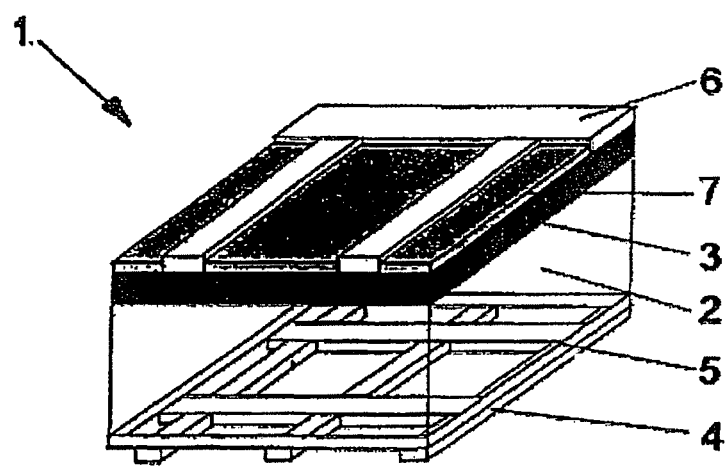
FIG. 1 is a schematic structure of a solar cell 1.

In the simplest form, solar cells comprise a full-area base 2 and emitter sections 3, with the emitter 3 being located at the side facing the light, i.e. the front of the solar cell. For the purpose of illustration, here reference is made to FIG. 1 showing a solar cell 1 of prior art.

For electrically contacting the base 2, usually the rear of the solar cell 1 is provided with a metal layer 4 extending over the entire area, upon which in turn suitable rear contacting—conductor circuits 5 are applied, for example made from AlAg. The emitter range 3 contacts a metal grid 6, with here the object is given to lose as little light as possible for the solar cell due to reflection at the metal contact, i.e. the metal grid 6 comprises a finger structure in order to cover as little of the area of the solar cell as possible. In order to optimize the performance yielded from the solar cell 1 it is additionally attempted to keep the optic loss due to reflection as little as possible. This is achieved by the deposit of so-called anti-reflection coating 7 (ARC) on the frontal surface of the solar cell 1. The layer thickness of the anti-reflection coating 7 is selected such that straight, destructive interference of the reflected light results in the spectral range most important with regards to energy. The anti-reflection materials used are titanium dioxide, silicon nitride, and silicon dioxide, for example. Alternatively or additionally thereto, a reduction of reflection can be achieved by producing a suitable surface texture using etching and/or mechanical processing, as also discernible from the solar cell shown in FIG. 2. Here, the emitter area 3 as well as the anti-reflection coating 7 applied upon the emitter, are embodied with such a structure that the light impinging the structured surface of the solar cell 1 has an increased probability of coupling at the structures embodied like pyramids. Even in case of a solar cell according to FIG. 2, the electric contacting of the emitter 3 occurs with a metal grid 6 as delicate as possible, with only one small contacting finger being shown in FIG. 2. Furthermore, the anti-reflection coating 7 can also serve as a passivating layer, which serves as a mechanical surface protection but additionally also shows intrinsic effects with regards to reducing surface-recombination processes, which is explained in greater detail in the following.

With regards to the electric contacting of a solar cell, it must be differentiated between the front and the rear. While at the rear of the solar cell it is attempted to create a contact, which is primarily characterized in a low contacting and conducting resistance, the front must additionally allow the reception of as much light as possible to the solar cell. Thus, usually a comb-shaped structure is created at the front, as discernible from FIG. 1, in order to keep losses from both resistance as well as shadowing as little as possible. Usually, either fully covering or structured, e.g., grid-like, contacts are used at the rear of the solar cell.

Figure 2:
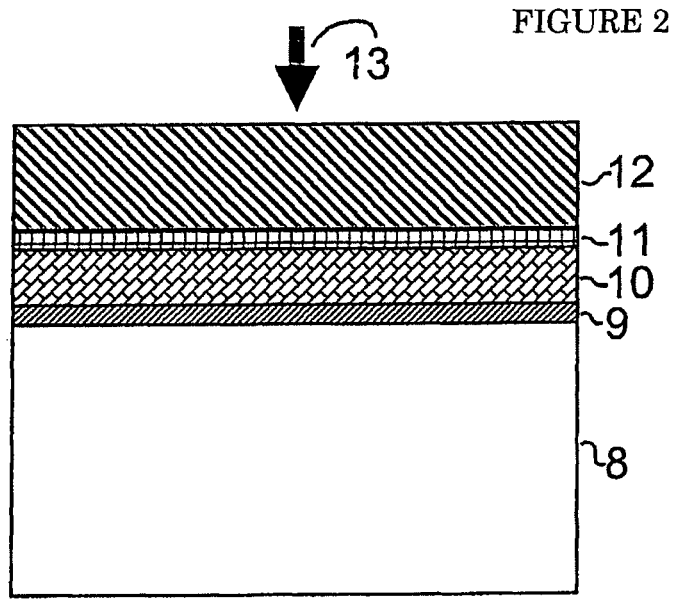
FIG. 2 is a section of the resulting layer structure at the rear of the solar cell according to FIG. 1 prior to the local melting step.
Figure 3:
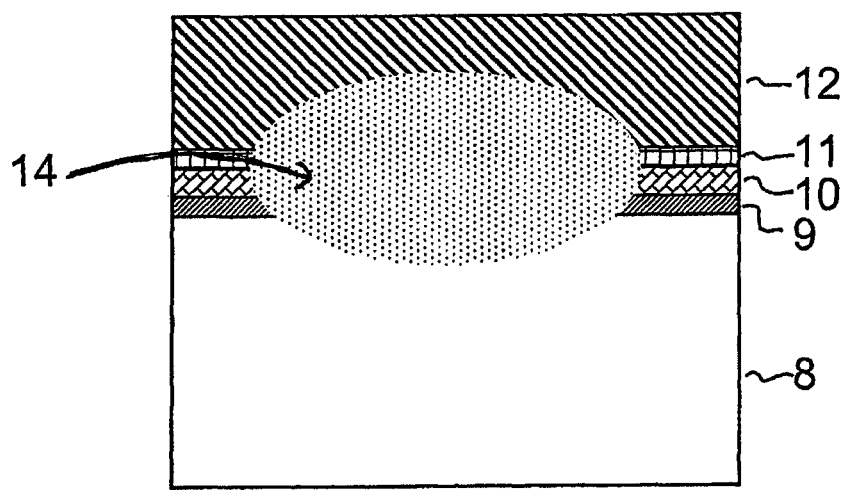
FIG. 3 is the section according to FIG. 2 after the melting and solidification of the melt-mixture.

A section of the resulting laminate structure at the rear of the solar cell is shown in FIG. 2, with the sequence of layers being inversed in FIGS. 2 and 3, i.e. the layer positioned at the bottom in the solar cell is shown at the top in FIGS. 2 and 3.

The rear contacts of these solar cells, shown in FIG. 1, are advantageously created by the method according to the invention. In the following, this creation is explained using FIGS. 2 and 3, which show a section of a local area at the rear of the solar cell shown in FIG. 1, in which a local electric contact and a locally high doping is created. In this exemplary embodiment, a silicon disk (or silicon wafer) 8 represents a semiconductor layer, from which the solar cell is produced, shown in FIG. 1. A passivating layer 9 made from silicon dioxide, approx. 10 nm thick, is applied upon the silicon disk 8. Subsequently a thin layer of high-doped boron-silicate glass is applied, approximately 80 nm thick. This doping layer 10 comprises the dopant boron in a concentration of approximately $2 \times 10^{21}$ cm$^{-3}$.

An anti-reflection coating 11, approx. 10 nm thick, is embodied as a silicon-dioxide layer and applied upon the doping layer 10.

In this exemplary embodiment therefore a total of 3 intermediate layers are applied upon the silicon disk 8 (processing step A i.)

Subsequently, a metal layer 12, made from aluminum and having a thickness from approximately 2 μm to 3 μm (processing step A ii.) is applied upon the last intermediate layer, i.e. the silicon-dioxide layer.

Subsequently, using a brief local radiation at the location 13 of the aluminum layer a melt-mixture created from aluminum, the thin intermediate layers located underneath it, and an area of a depth of a few μm of the semiconductor layer, i.e. the silicon disk 8, is produced. The radiation occurs for a period from approx. 50 to 5000 ns. After the end of the local radiation an area with a thickness of a few μm recrystallizes from the previously formed melt-mixture. This is schematically shown in FIG. 3 by the area 14 for the contact formed.

The dopant boron shows a solubility of approximately $3 \times 10^{19}$ cm$^{-2}$ in silicon, compared to the considerably lower solubility of aluminum amounting to $3 \times 10^{18}$ cm$^{-2}$ in silicon. Therefore, during recrystallization the boron is integrated in the crystalline grid with a much higher concentration when the silicon structure forms during solidification due to the considerably higher solubility compared to aluminum. The solidified area therefore comprises a local boron-high doping and additionally an electric contact is created between the metal layer 12 and the silicon disk 8 (processing step D).

Therefore, the method according to the invention is advantageous for the local contacting of a solar cell in reference to methods of prior art according to DE 100 46 170 A1: Due to the higher doping with boron in the area of the electric contacting a significantly lower recombination rate is realized at the contacts. This way, an increased number of contact points can be implemented, i.e. an increased overall area of electric contacts, without reducing the effectiveness of the solar cell due to increased recombination. However, due to the increased overall area of the electric contacting the electric output resistance is reduced when charged carriers are conducted from the silicon disk via the metal layer, so that overall the effectiveness of the solar cell is increased.

The above-described exemplary embodiment relates to the production of the rear contacts of the solar cell shown in FIG. 1. However, the scope of the invention also covers using the method according to the invention for the creation of frontal contacting and/or for a n-doped semiconductor layer.

The invention claimed is:

1. A method for local contacting and local doping of a semiconductor layer, comprising the following processing steps:
   A) creating a layer structure on the semiconductor layer by
      i) applying at least one intermediate layer (9, 10, 11) on one side of the semiconductor layer, and
      ii) applying at least one metal layer (12) on the intermediate layer (11) applied last in the step i., with the metal layer at least partially covering a last applied the intermediate layer (11),
   B) locally heating the layer structure such that in a local area briefly a melt-mixture is formed of at least sections comprising the layers: the metal layer (12), the at least one intermediate layer (9, 10, 11), and the semiconductor layer, and after solidification of the melt-mixture an electric contacting forms between the metal layer (12) and the semiconductor layer,
   wherein in step A) i), at least one of the intermediate layers applied comprises a doping layer (10), which includes a dopant, with the dopant showing greater solubility in the semiconductor layer than the metal of the metal layer; and in step B, a locally high doping develops in the area of the electric contact between the metal layer and the semiconductor layer due to the dopant wherein the doping layer (10) has a layer resistance which is greater than a layer resistance of the metal layer (12) by at least a factor of 10 and wherein an additional intermediate layer (9) is applied between the semiconductor layer and the doping layer (10) such that a passivation of a boundary area between the semiconductor layer and the additional intermediate layer is formed.

2. A method according to claim 1, wherein a concentration of the dopant in the doping layer (10) is equal or greater than $5 \times 10^{21}$ cm$^{-3}$.

3. A method according to claim 1, wherein a concentration of the dopant in reference to a boundary area of the doping layer (10) to the semiconductor layer or the intermediate layer is equal or greater than $2.5 \times 10^{14}$ cm$^{-2}$.

4. A method according to claim 1, wherein the dopant includes a Group III or Group V element.

5. A method according to claim 1, wherein the doping layer (10) comprises boron-silicate glass.

6. A method according to claim 1, wherein the intermediate layer (9) applied on the semiconductor layer has a passivating effect with regards to a speed of surface recombination at a boundary area of the semiconductor layer/intermediate layer.

7. A method according to claim 1, wherein the doping layer (10) is thinner than 1 μm.

8. A method according to claim 1, wherein the local area in which the layers are melted has a diameter smaller than 500 μm.

9. A method according to claim 1, wherein the local melting occurs in an essentially punctual or linear area.

10. A method according to claim 1, wherein a multitude of local areas are melted, with an overall portion of an area of all sections in reference to a total surface of the semiconductor layer is less than 20%.

11. A method according to claim 1, wherein in step B locally a heating occurs to at least 550° C.

12. A method according to claim 1, wherein the doping layer (10) is electrically insulating.

13. A method according to claim 1, wherein at least a first layer applied on the semiconductor layer is an optically transparent layer.

14. A method according to claim 1, wherein an additional intermediate layer (11) is applied between the doping layer (10) and the metal layer (12), and the additional intermediate layer (11) has no corrosive features in reference to the metal layer.

15. A method according to claim 1, wherein the additional intermediate layer (9) applied between the semiconductor layer and the doping layer (10), comprises silicon dioxide or amorphous silicon or amorphous silicon nitride or aluminum oxide.

16. A method according to claim 1, wherein the doping layer (10) is applied via a chemical vapor deposition or via evaporation deposition or cathode-sputtering or as a spin-on layer.

* * * * *